United States Patent [19]
Hanson et al.

[11] Patent Number: 5,888,087
[45] Date of Patent: Mar. 30, 1999

[54] ONE-HANDED DOCK FOR A PORTABLE DATA COLLECTION TERMINAL

[75] Inventors: George E. Hanson, Andover, Kans.; John G. Pavek, Dyersville, Iowa

[73] Assignee: Norand Corporation, Cedar Rapids, Iowa

[ * ] Notice: The term of this patent shall not extend beyond the expiration date of Pat. No. 5,466,170.

[21] Appl. No.: 772,538

[22] Filed: Dec. 24, 1996

Related U.S. Application Data

[63] Continuation-in-part of Ser. No. 557,762, Nov. 13, 1995, abandoned, which is a continuation-in-part of Ser. No. 146,882, Nov. 2, 1993, Pat. No. 5,466,170, said Ser. No. 772,538, Dec. 24, 1996, is a continuation-in-part of Ser. No. 647,477, May 14, 1996, which is a division of Ser. No. 171,390, Dec. 21, 1993, Pat. No. 5,517,434, which is a continuation-in-part of Ser. No. 50,704, Apr. 21, 1993, abandoned, which is a continuation-in-part of Ser. No. 909,139, Jul. 6, 1992, abandoned, which is a continuation of Ser. No. 345,200, Apr. 28, 1989, abandoned, which is a continuation-in-part of Ser. No. 305,302, Jan. 31, 1989, abandoned, said Ser. No. 171,390, is a continuation-in-part of Ser. No. 561,994, Jul. 31, 1990, abandoned.

[51] Int. Cl.[6] .................................................... H01R 13/64
[52] U.S. Cl. .......................... 439/374; 439/297; 439/929
[58] Field of Search ..................................... 439/292, 293, 439/297–299, 310, 374, 929, 919, 923; 235/430, 462, 472, 454; 364/708.1, 709.01, 709.04, 424.04

[56] References Cited

U.S. PATENT DOCUMENTS

| | | |
|---|---|---|
| 2,024,622 | 12/1935 | Bates . |
| 2,794,664 | 6/1957 | Kruger . |
| 3,143,697 | 8/1964 | Springer . |
| 3,348,116 | 10/1967 | Freeman et al. . |

(List continued on next page.)

FOREIGN PATENT DOCUMENTS

| | | |
|---|---|---|
| 385502 | 9/1990 | European Pat. Off. . |
| 2567304 | 1/1986 | France . |
| 8438263 | 3/1985 | Germany . |
| 8500180 | 6/1985 | Germany . |
| 3408594 | 9/1985 | Germany . |

(List continued on next page.)

OTHER PUBLICATIONS

Advertising Brochure, "4000 Series Communications Network", Norand Data Systems, Cedar Rapids, Iowa, 1989.

Advertising Material, "80–Column and 40–Column Van Mount Printers", Norand Data Systems, Cedar Rapids, Iowa.

Advertising Material, "80–Column Modular Printer", Norand Data Systems, Cedar Rapids, Iowa, 1988.

(List continued on next page.)

*Primary Examiner*—Neil Abrams
*Assistant Examiner*—Brian J. Biggi
*Attorney, Agent, or Firm*—Simmons, Perrine, Albright & Ellwood

[57] ABSTRACT

A docking device for a data collection terminal comprises a latch which positively retains an inserted data collection terminal in a docking position wherein communication and power contacts of the data collection terminal are communicatively coupled to complementary contacts of the docking device. The latch urges the inserted data collection terminal into a latched rest position with an optimal minimum contact engagement force, such that any shock or vibration has a tendency to increase the contact engagement force to thereby eliminate an inadvertent opening of contacts due to shock or vibration. The latch is adapted to facilitate one-handed insertion and removal of the data collection terminal into and from the docking device. The docking device includes a scanner bracket for holding a scanner operably connected to the data collection terminal wherein the scanner, inserted in the bracket, and the controls of the data collection terminal, inserted into the docking device, remain accessible to a user thereof.

20 Claims, 8 Drawing Sheets

U.S. PATENT DOCUMENTS

| | | |
|---|---|---|
| 3,390,319 | 6/1968 | Robison . |
| 3,745,565 | 7/1973 | Daines et al. . |
| 3,826,900 | 7/1974 | Moellering . |
| 3,830,554 | 8/1974 | Moussaian et al. . |
| 3,895,768 | 7/1975 | Scheck . |
| 4,038,535 | 7/1977 | Aldridge et al. . |
| 4,084,214 | 4/1978 | Eppich . |
| 4,141,616 | 2/1979 | Gottlieb . |
| 4,208,081 | 6/1980 | Kekas et al. . |
| 4,345,147 | 8/1982 | Aaron et al. . |
| 4,387,297 | 6/1983 | Swartz et al. . |
| 4,396,985 | 8/1983 | Ohara . |
| 4,397,513 | 8/1983 | Clark et al. . |
| 4,403,271 | 9/1983 | Flanigan et al. . |
| 4,409,470 | 10/1983 | Shepard et al. . |
| 4,458,813 | 7/1984 | Tushinsky et al. . |
| 4,468,750 | 8/1984 | Chamoff et al. . |
| 4,481,458 | 11/1984 | Lane . |
| 4,527,285 | 7/1985 | Kekas et al. . |
| 4,558,270 | 12/1985 | Liautaud et al. . |
| 4,588,938 | 5/1986 | Liautaud et al. . |
| 4,590,943 | 5/1986 | Paull et al. . |
| 4,620,808 | 11/1986 | Kurtin et al. . |
| 4,621,189 | 11/1986 | Kumar et al. . |
| 4,628,193 | 12/1986 | Blum . |
| 4,629,962 | 12/1986 | Arakawa . |
| 4,634,304 | 1/1987 | Narushima et al. . |
| 4,645,275 | 2/1987 | Pucci . |
| 4,701,003 | 10/1987 | Gruet . |
| 4,706,096 | 11/1987 | Sato . |
| 4,721,849 | 1/1988 | Davis et al. . |
| 4,723,281 | 2/1988 | Peiker et al. . |
| 4,727,245 | 2/1988 | Dobbins et al. . |
| 4,739,183 | 4/1988 | Tokura et al. . |
| 4,739,316 | 4/1988 | Yamaguchi et al. . |
| 4,742,335 | 5/1988 | Vogt . |
| 4,746,932 | 5/1988 | Sato . |
| 4,751,648 | 6/1988 | Sears, III et al. . |
| 4,758,717 | 7/1988 | Shepard et al. . |
| 4,766,300 | 8/1988 | Chadima, Jr. et al. . |
| 4,773,032 | 9/1988 | Uehara et al. . |
| 4,790,431 | 12/1988 | Reel et al. . |
| 4,801,786 | 1/1989 | Stobbe . |
| 4,801,924 | 1/1989 | Burgmann et al. . |
| 4,806,906 | 2/1989 | Oda et al. . |
| 4,835,372 | 5/1989 | Gombrich et al. . |
| 4,845,738 | 7/1989 | Takano . |
| 4,846,924 | 7/1989 | Morrison . |
| 4,853,521 | 8/1989 | Claeys et al. . |
| 4,857,716 | 8/1989 | Gombrich et al. . |
| 4,881,839 | 11/1989 | Grimm . |
| 4,894,523 | 1/1990 | Chadima, Jr. et al. . |
| 4,916,441 | 4/1990 | Gombrich . |
| 4,922,125 | 5/1990 | Casanova et al. . |
| 4,953,113 | 8/1990 | Chadima, Jr. et al. . |
| 4,970,379 | 11/1990 | Danstrom . |
| 5,023,824 | 6/1991 | Chadima, Jr. et al. . |
| 5,031,098 | 7/1991 | Miller et al. . |
| 5,052,943 | 10/1991 | Davis . |
| 5,180,232 | 1/1993 | Chadima, Jr. et al. . |
| 5,186,558 | 2/1993 | Sherman et al. . |
| 5,195,183 | 3/1993 | Miller et al. . |
| 5,203,021 | 4/1993 | Repplinger et al. . |
| 5,289,378 | 2/1994 | Miller et al. . |
| 5,310,358 | 5/1994 | Johnson et al. . |
| 5,331,580 | 7/1994 | Miller et al. . |
| 5,466,170 | 11/1995 | Pavek ........................................ 439/374 |
| 5,517,434 | 5/1996 | Hanson et al. . |
| 5,521,370 | 5/1996 | Hanson . |

FOREIGN PATENT DOCUMENTS

| | | |
|---|---|---|
| 8801332 | 8/1988 | Germany . |
| 56-34468 | 4/1981 | Japan . |
| 60-198273 | 10/1985 | Japan . |
| 62-7582 | 1/1987 | Japan . |
| 173434 | 2/1935 | Switzerland . |
| 2045726 | 11/1980 | United Kingdom . |
| 2153237 | 8/1985 | United Kingdom . |
| 2175749 | 12/1986 | United Kingdom . |
| 8805573 | 7/1988 | WIPO . |
| 8805940 | 8/1988 | WIPO . |

OTHER PUBLICATIONS

Advertising brochure, "VM100 Vehicle Mount for Portable Radio Data Terminals", Norand Data Systems, Cedar Rapids, Iowa, 1988.

Advertising brochure, "RT2210 Radio Data Terminal", Norand Data Systems, Cedar Rapids, Iowa, 1987.

Advertising brochure, "RT2210XL Radio Data Terminal", Norand Data Systems, Cedar Rapids, Iowa, 1988, 1989.

Advertising brochure, "CA5950 Communications Adapter Specifications", Norand Data Systems, Cedar Rapids, Iowa, 1991.

Drawing No. 709–746, "Radio Mount", Norand Data Systems, Cedar Rapids, Iowa, 1987.

ONE-HANDED DOCK FOR A PORTABLE DATA COLLECTION TERMINAL

CROSS-REFERENCE TO RELATED APPLICATIONS

This application is a continuation-in-part of application Ser. No. 08/557,762 filed Nov. 13, 1995 now abandoned, which is a continuation-in-part of application Ser. No. 08/146,882 filed Nov. 2, 1993, now U.S. Pat. No. 5,466,170 issued Nov. 14, 1995. This application is also a continuation-in-part of copending application Ser. No. 08/647,477 filed May 14, 1996, which is a divisional of application Ser. No. 08/171,390 filed Dec. 21, 1993, now U.S. Pat. No. 5,517,434 issued May 14, 1996, which is a continuation-in-part of application Ser. No. 08/050,704 filed Apr. 21, 1993 (now abandoned), which is a continuation-in-part of application Ser. No. 07/909,139 filed Jul. 6, 1992 (now abandoned), which is a continuation of application Ser. No. 07/345,200 filed Apr. 28, 1989 (now abandoned), which is a continuation-in-part of application Ser. No. 07/305,302 filed Jan. 31, 1989 (now abandoned).

Said application Ser. No. 08/171,390 is also a continuation-in-part of application Ser. No. 07/561,994 filed Jul. 31, 1990 (now abandoned). Said application Ser. No. 07/561,994 is a continuation-in-part of each of the following abandoned applications which are incorporated by reference in application Ser. No. 07/561,994, and these applications and their related U.S. Patents as shown below are hereby incorporated herein by reference in their entireties including all drawings and appendices:

| U.S. Application No. | Filing Date | Inventor(s) | Attorney Docket No. |
|---|---|---|---|
| 07/305,302 | January 31, 1989 | G. Hanson, et al. | 6649 |

The subject matter of Application No. 07/305,302 has been published in U.S. Pat. No. 5,289,378 issued February 22, 1994 based on a continuation of Application No. 07/305,302.)

| | | | |
|---|---|---|---|
| 07/345,200 | April 28, 1989 | G. Hanson | 6649X |
| 07/347,602 | May 3, 1989 | G. Hanson, et al. | 6649XX |

The subject matter of Application No. 07/347,602 has been published in U.S. Pat. No. 5,331,580 issued July 19, 1994 based on a continuation of Application No. 07/347,602.)

| | | | |
|---|---|---|---|
| 07/357,849 | May 3, 1989 | G. Hanson, et al. | 6504XX |

The subject matter of Application No. 07/347,849 has been published in U.S. Pat. No. 5,195,183 issued March 16, 1993 based on a continuation of Application No. 07/347,849.)

BACKGROUND OF THE INVENTION

1. Field of the Invention

This invention relates generally to data processing systems and, more particularly, to docking apparatus which removably receives and retains portable data collection terminals, including communications and power terminals, which become coupled to such a portable data collection terminal upon insertion of the portable data collection terminals into the docking apparatus. This invention also relates generally to apparatus for, and methods of, retaining a data terminal within the docking apparatus and to apparatus for and methods of establishing and maintaining communicative contact with respective communications and power terminals within the docking apparatus.

2. Description of the Related Art

Hand-held, portable data collection terminals are well known as practical workstations which operators may readily port to various work sites and collect business transaction or inventory data at such work sites. The data collection terminals are therefore essential elements of many business systems, providing the ability to remotely update central processing units of these systems. Communication between the portable data collection terminals and the central data processing unit may be provided on a continuous basis, such as by RF data transceivers or other suitable wireless communications links. In many applications, batch data transfer from the data collection terminals to the respective information systems may be more practical and may be the preferred method of transfer.

Portable data collection terminals are typically powered by self-contained power sources, such as rechargeable batteries for example. The sizes or capacities of batteries are desirably chosen to permit each respective, portable data collection terminal to operate throughout a normal workday. At the end of an operational cycle, or at the end of a period of use, the data collection terminal may be inserted into a docking device, sometimes referred to as a terminal dock. When a data collection terminal is inserted into a terminal dock, or simply dock, the power source of the inserted data collection terminal becomes coupled to a battery recharging circuit. Recharging periods may be efficiently used by transferring collected data from the data collection terminal to a central data processing unit of a respective business system and by updating the data collection terminal with data and instructions for subsequent use as the batteries of the data collection terminal are being recharged.

The ability to pre-load a set of instructions into a data collection terminal before each use offers an opportunity to make the data collection terminals more task-specific and, hence, more user friendly. For example, a set of merchandise identification numbers and related instruction information may be transferred to the data collection terminal during the recharging period. During a subsequent use period, an operator may be directed by such transferred instructions to collect inventory data on the respective items of merchandise based on the specific merchandise identification numbers or codes which had been pre-loaded and which may appear in sequence as the desired inventory information is being collected. After inventory quantities on all pre-loaded items have been collected, the data collection terminal may inform the operator that the task is completed, and to return the data collection terminal to a docking device for a data transfer of the collected inventory information to the central processing unit.

The transfer of specific batches of information via a dock may also advantageously apply to other operations, such as to route delivery operations, for example, where a user of the data collection terminal may be out of radio contact with a fixed RF receiving station of a central data processing system. Thus, a docking device is generally regarded to be a most desirable, if not necessary, complement for a portable data collection terminal.

Usefulness of data collection terminals can be enhanced with increased accessibility to docking devices, particularly docking devices that are more facilitating by providing positive data collection terminal locking devices and ready, one-handed and effortless removal and reinsertion of data collection terminals from and into such docking devices.

Much engineering effort has already been directed to improving existing terminal docks. However, an inherent conflict continues to exist between a desire to reduce the amount of effort needed to insert or remove a data collection terminal into and from a dock, and a need to assure establishing proper terminal connections between electrical and communications terminals of an inserted data collection terminal and corresponding terminals of the dock. For example, it has been found that a single defective connection in a charge monitoring circuit may not only destroy a battery of the data collection terminal, but may actually destroy the data collection terminal itself. Also, intermittent breaks in data connections between a docked data collection terminal and its respective dock may cause errors to be transferred to a central processing unit, or may cause erroneous work requests to be transferred to the data collection terminal. Particularly in route operations, where such erroneous information may not be discovered until a driver has driven many miles, any data loss to or from a data collection terminal due to contact bounce or bad communications connections is clearly unacceptable.

SUMMARY OF THE INVENTION

According to the invention, a one-handed end-insertion docking device for a portable data collection terminal comprises a docking channel which has an insertion opening at an insertion portion thereof The docking channel has a base surface along the length thereof and retention caps longitudinally of the docking device bounding a terminal access opening opposite the base surface of the docking channel. A plurality of spring contacts are disposed at a docking seat at a retention end opposite the insertion end. The spring contacts are yieldably disposed in the insertion path of a data collection terminal inserted into the docking device. Upon insertion of a data collection terminal longitudinally of the insertion path toward the docking seat, the spring contacts yieldably engage complementary surface contacts on the data collection terminal. A retention pawl mechanism includes at least one retention prong which is biased with a bias force toward an inserted data collection terminal to engage and positively latch such a data collection terminal so inserted in a retention position against the docking seat and in a direction away from engagement with the spring contacts.

The positive locking or latching feature which biases a retained, inserted data collection terminal into a defmed position away from spring contacts of the docking device, hence into a position at which spring contact forces are relatively low, may appear on first glance undesirable. However, it may be realized from the detailed description of the invention that any vibrational movement of the data collection terminal, such as may be caused by shock or vibration in an industrial environment, for example when the docking device is mounted on board of a vehicle, is found to increase the contact force. Thus, a chance of an undesirable contact bounce, or even a temporary decoupling of complementary contact surfaces, is substantially minimized if not avoided, even under severe vibratory conditions.

According to one particular aspect of the end-insertion docking device in accordance with the invention, the retention pawl mechanism may comprise at least one retention pawl supporting the retention prong at one end thereof The retention prong would be oriented to engage and retain an inserted data collection terminal. The other end of the pawl may be mounted in accordance herewith to a co-pivotal pivot shaft. A release is also co-pivotally mounted to the pivot shaft and extends from the pivot shaft over a length which exceeds the length of the pawl to move the retention prong out of a retention position with a lesser force than a bias force against an inserted data collection terminal.

According to another particular aspect which may be found in an end-insertion docking device pursuant to the invention, the docking seat includes a seat base which is movably mounted to move longitudinally of the docking channel in a direction toward and away from the insertion portion. The seat base is spring biased toward the insertion portion and into the insertion path of a data collection terminal being inserted into the insertion portion of the docking channel. A data collection terminal, upon being inserted into the docking channel, would be inserted with an insertion force which overcomes the spring bias to which the seat base is subjected to move the seat base in a direction away from the insertion end until the pawl engages the data collection terminal and retains the data collection terminal in the terminal docking device.

Insertion friction between the data collection terminal and the end-insertion docking device may be minimized by the guides having the shape of spherical and cylindrical surfaces whereby minimal contacts, such as point or line contacts, are established with edges of a data collection terminal being inserted into the docking channel. The guides, in accordance with the invention, would be disposed adjacent the base surface of the docking channel to bias a data collection terminal in contact therewith toward the retaining caps of the docking channel.

The dock for a portable data collection terminal may optionally include a bracket for receiving a scanner connected to the portable data collection terminal wherein the scanner inserted into the bracket, as well as the controls of the data collection terminal inserted into the dock, remain accessible to a user.

In addition to the foregoing, the summary of invention of each of the following patents are hereby incorporated herein by reference: U.S. Pat. No. 5,466,170 issued Nov. 14, 1995, John G. Pavek, inventor; and U.S. Pat. No. 5,517,434 issued May 14, 1996, G. Hanson et al, inventor.

PRINCIPAL OBJECTS AND ADVANTAGES OF THE INVENTION

The principal objects and advantages of the present invention include: to provide a terminal dock that facilitates ready one-handed insertion and removal of a data collection terminal into and from the terminal dock; to provide such a terminal dock that provides electrical and signal contact connections with a data collection terminal inserted therein such that there is minimal tendency for the connections to separate under severe shock or vibratory conditions; to provide such a terminal dock that may temporarily hold a data collection terminal without communicative or electrical connections and from which a data collection terminal may be removed without being unlocked from a positive retention position in the terminal dock; to provide such a terminal dock that retains a data collection terminal within a receiving cradle of the terminal dock by a positive retaining lock, to provide such a terminal dock having a terminal release mechanism that, upon activation, urges the data collection terminal out of electrical and communicative engagement with terminals of the terminal dock to prevent inadvertent selective engagement of such contacts; to provide such a terminal dock that includes a bracket for receiving a scanner operably connected to the data collection terminal as the data collection terminal is received by the terminal dock; to provide such a terminal dock that holds a data collection terminal and a scanner operably connected to the data collection terminal wherein the scanner and the controls of the data collection terminal remain accessible to a user; and to generally provide such a terminal dock that is efficient and reliable in operation and performance, capable of long operating life, and particularly well suited for the proposed uses thereof.

Other objects and advantages of this invention will become apparent from the following description taken in conjunction with the accompanying drawings wherein are set forth, by way of illustration and example, certain embodiments of this invention.

BRIEF DESCRIPTION OF THE DRAWINGS

The detailed description of the invention may be read in reference to the appended drawings wherein.

DETAILED DESCRIPTION OF THE INVENTION

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Figures 1, 2, 4:
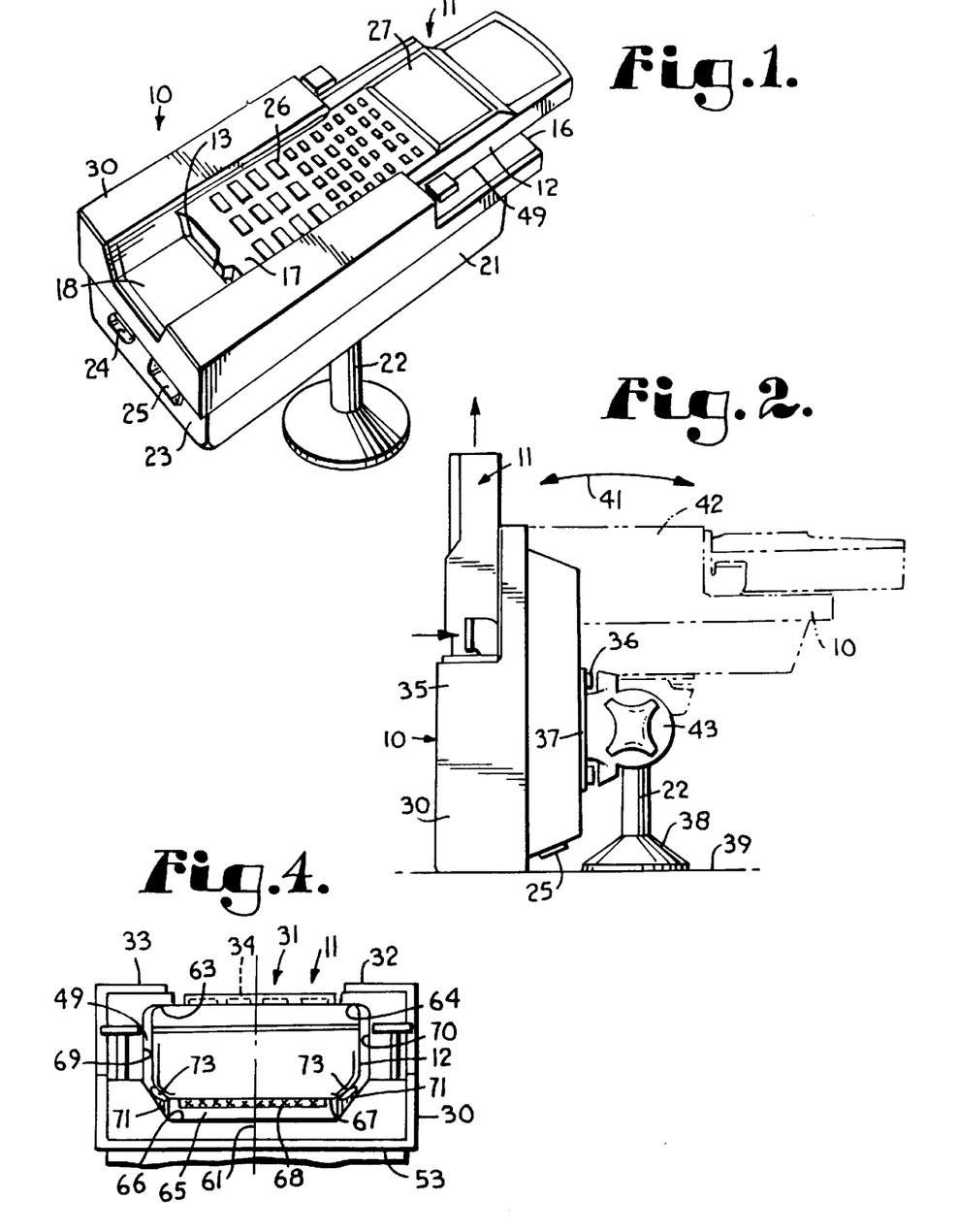
FIG. 1 is a perspective view of a one-handed dock for a portable data collection terminal, showing a data collection terminal inserted therein, according to the present invention.
FIG. 2 is a side elevational view of the one-handed dock for a portable data collection terminal, showing a swivel or pivot mounting arrangement thereof.
FIG. 4 is an enlarged and fragmentary, end elevational view of the one-handed dock for a portable data collection terminal, taken along line 4—4 of FIG. 3, with portions cut away to reveal details thereof.

FIG. 1 is an overall perspective representation of a dock or docking device 10 which represents an embodiment of the present invention. FIG. 1 also shows a hand-held terminal 11, such as a data collection terminal 11, in a fully inserted position within the docking device 10. In such a fully inserted position, the data collection terminal 11 is positively retained by the docking device. The fully inserted position may sometimes be referred to herein as a locked position of the data collection terminal 11. A housing 12 of the data collection terminal 11 is generally of elongate and rectangular shape. Such elongate shape of the data collection terminal 11 not only makes it easier for a person to hold the terminal 11 with one hand, but also provides lateral restraint as the data collection terminal 11 is inserted into the docking device 10.

A retention cavity 13 of the docking device 10 extends generally in a longitudinal direction generally centrally within the docking device 10. A cross section through the retention cavity 13 is somewhat larger in area than a cross-sectional shape of the data collection terminal 11 and is, therefore, of ample size for receiving the data collection terminal 11 without undue restraint. When the docking device 10 is vacant and available to receive the data collection terminal 11, such data collection terminal 11 is insertable from an insertion end 16 into the retention cavity 13 of the docking device 10, with a lower contact end 17 of the data collection terminal 11 disposable adjacent a retention end 18 opposite the insertion end 16 of the docking device 10.

FIG. 1 shows the docking device 10 mounted onto a communications base 21, which, in turn is supported by a pivot mount 22. The communications base 21 internally includes communication cable splitters and may provide, for example, a mounting surface 23 for communications and power plugs, such as connectors 24 and 25. As with other known docking devices, it is desirable that the data collection terminal 11 remains operational while being retained in the docking device 10. Thus, a keyboard 26 and a display screen 27 of the data collection terminal 11 desirably remain accessible while the data collection terminal 11 is retained in the docking device 10.

An outer housing shell 30 of the docking device 10 preferably has a C-shaped cross-sectional configuration, as shown in FIG. 4. The outer housing shell 30 is the outer skeleton of the docking device 10 and imparts external ruggedness by preferably being constructed of an extruded aluminum channel, or other suitable structure. Referring to FIG. 4, an open gap 31 between lateral caps 32 and 33 of the channel structure of the outer housing 30 provides top access to keys 34 of the keyboard 26. FIG. 2 shows a side view of the docking device 10. The channel member of the outer housing shell 30 is more clearly shown as a modified channel in that sides 35, including the caps 32 and 33, have been partially cut back or removed adjacent the insertion end 16 of the docking device 10. Thus, the insertion end 16 has the appearance of a stepped end.

The outer housing shell 30 is attached to the communications base 21. The communications base 21 is, in turn, attached by typical threaded fasteners 36 to a mounting base 37 of the pivot mount 22. With a pedestal 38 being firmly attached to a mounting surface 39, the docking device 10 may be pivoted through a substantial arc as indicated by an arrow designated by the numeral 41 in FIG. 2, to selectively adjust the docking device 10 to any number of convenient orientations, an alternate horizontal orientation of the docking device 10, being shown in dashed lines designated by the numeral 42 in FIG. 2. The pivot mount 22 may be rigidly locked in any of these adjusted positions by a hand knob 43. The use of the pivot mount 22 is looked upon as particularly advantageous for mounting the docking device 10 onboard service vehicles, for example, such as fork lift trucks and the like.

Figure 3:
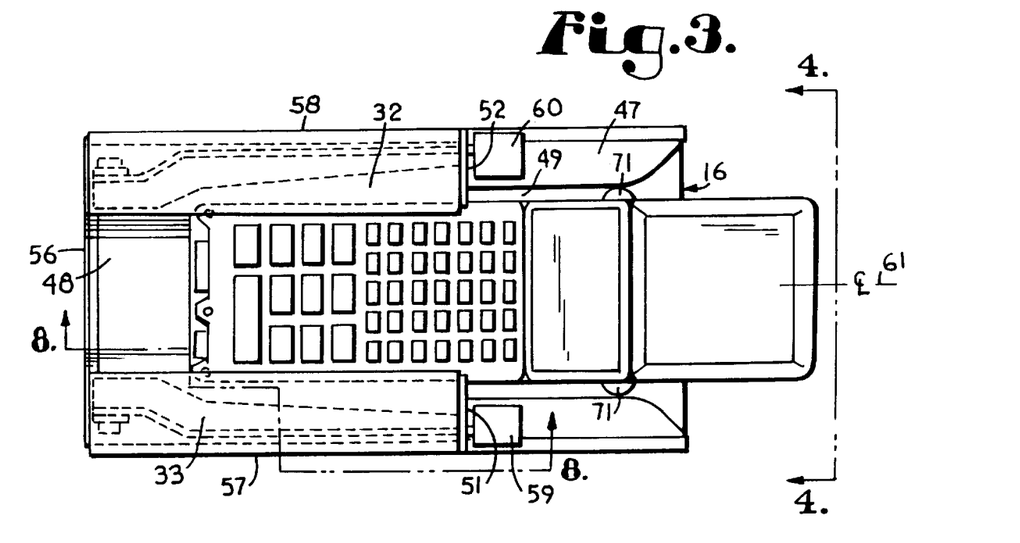
FIG. 3 is an enlarged top plan view of the one-handed dock for a portable data collection terminal.

FIG. 3 is a top or plan view of the docking device 10 showing, at least partially, several major structural elements of the docking device 10. The docking device 10 is best suited for its intended purpose by exhibiting exceptional ruggedness for withstanding hazards and harsh treatment common to industrial environments, such as in factories and warehouses or on route delivery trucks. The docking device 10 also provides protection for the data collection terminal 11 retained therein, and further provides minimal frictional resistance during insertion and retraction of the data collection terminal 11. The outer housing shell 30 in the form of an extruded aluminum channel has been found to provide an acceptable degree of protection and ruggedness.

Inserted into the outer housing shell 30 are a docking seat molding 46, an insertion guide molding 47, and a seat base molding 48 as major internal structural elements, which may be constructed of molded high impact plastic, or other suitable material. The insertion guide molding 47 is disposed at the insertion end 16 of the outer housing 30. The docking seat molding 46 is disposed adjacent the insertion guide molding 47. The insertion guide molding 47 and the adjacent docking seat molding 46 form, by their mutual longitudinally adjoining arrangement, a docking channel 49 for the data collection terminal 11, which merges into and terminates at its lower end in the retention cavity 13. The molded plastic elements of the docking seat molding 46, the insertion guide molding 47, and the seat base molding 48 are further protected, aligned, and held in their respective positions by the outer housing shell 30.

A preferred assembly sequence would generally proceed by initially inserting of the docking seat molding 46 from the insertion end 16 into the channel of the outer housing shell 30. The docking seat molding 46, which features right and left flanges 51 and 52 that establish the fully inserted position of the docking seat molding 46 within the outer housing shell 30, may then be appropriately fastened to a base wall 53 of the outer housing shell 30. The insertion guide molding 47 may thereafter be slid into position at the insertion end 16 of the docking device 10 and fastened to the base wall 53 of the outer housing shell 30. The seat base molding 48 may thereafter be slid into the outer housing shell 30 and into engagement with the docking seat molding 46 from the retention end 18 of the docking device 10, to be held in position, as herein will become more apparent, by a docking seat base plate 56.

The top view of the docking device 10 also depicts the presence, along right and left sides 57 and 58 of the docking device 10, right and left latch release levers 59 and 60, respectively. The docking device 11 is generally symmetric about a central plane through a longitudinal axis or centerline designated by the numeral 61 as shown in FIG. 3. The right and left latch release levers 59 and 60 are generally mirror images of each other and are preferably positioned such that one or the other is accessible by either a left-handed person or a right-handed person with equal ease. As is further seen from the plan view, the data collection terminal 11, fully inserted in the docking device 10, is retained by overlapping inner edges of the caps 32 and 33 of the outer housing shell 30.

In reference to FIG. 4, the caps 32 and 33 constitute a substantially rigid and strong backing and support for underlying molded plastic retaining ledges 63 and 64 of the docking seat molding 46, the retaining ledges 63 and 64 forming upper, overhanging retention caps having inwardly facing surfaces that contact the data collection terminal 11 as the data collection terminal 11 is retained within the docking channel 49. The retention ledges 63 and 64 are spaced so as not to impede access to the keyboard 34 of the data collection terminal 11 as the data collection terminal 11 is seated in the docking device 10.

FIG. 4, depicting an end view of the docking device 10 taken from the insertion end 16, shows a particularly advantageous structural feature of the docking device 10 and, particularly, of the docking seat molding 46 and the insertion guide molding 47. A clearly defined space 65 is shown to exist between an inner base wall 66 of the docking channel 49 and an adjacent lower surface 67 of the data collection terminal 11, as inserted into the docking device 10. In particular, the data collection terminal 11 has a handstrap 68, which may preferably form part of the data collection terminal 11 as a user enhancement and terminal protection device. A user may insert a hand between the data collection terminal 11 and the handstrap 68 to safely retain the data collection terminal 11, even though the user's handgrip on the data collection terminal 11 may be temporarily relaxed.

The material of the handstrap 68 may be an elastic woven, relatively soft material, or other suitable material. The presence of the handstrap 68 may impede ready insertion or removal of the data collection terminal 11 from the docking device 10. Thus, as shown in FIG. 4, upright walls 69 and 70 of the docking seat molding 46 have sufficient height to fixedly establish a spacing between the retention ledges 63 and 64 and the inner base wall 66 of the docking channel 49. A pair of upper guide pins 71 are laterally spaced transversely with respect to the centerline 61 through the docking channel 49. The pair of upper guide pins 71 is mounted from below through the insertion guide molding 47 to extend from the inner base wall 66 toward the upper or open side of the outer housing shell 30, i.e., toward the gap 31. The upper guide pins 71 are preferably spaced to engage rounded longitudinal edges of the housing 12 of the inserted data collection terminal 11.

Extending guide ends 73 of the upper guide pins 71 are sloped inwardly toward the centerline 61 through the docking channel 49 of the docking device 10. The extending guide ends 73 are also convexly cylindrically rounded with respect to a cylindrical axis, which hypothetically extends in a plane transverse to the centerline 61 and parallel to the direction of the slope of the guide surfaces 73 toward the center of the docking channel 49, to crown the inwardly sloping guide ends 73 such that contact between the upper guide pins 71 and the housing 12 of the data collection terminal 11 becomes, at most, a line contact, if not a point contact, since rounded edges of the housing 12 are rounded substantially perpendicularly to the rounded guide ends 73 of the upper guide pins 71. The guide ends 73 funnel the data collection terminal 11 toward the centerline 61 of the docking device 10.

Figure 5:
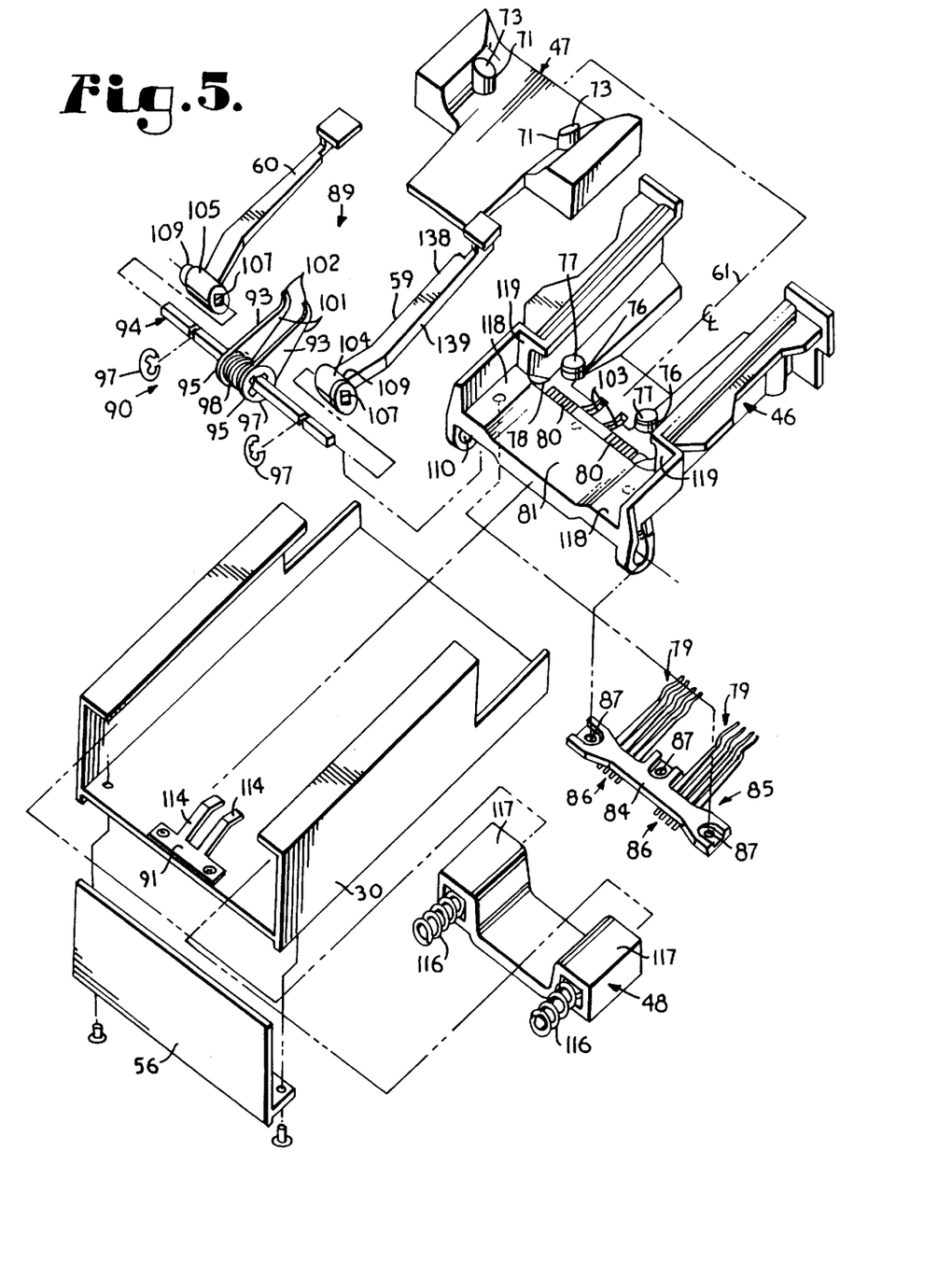
FIG. 5 is an enlarged and exploded view of the one-handed dock for a portable data collection terminal, showing a cradle portion thereof.

Referring now to FIG. 5, there is shown an exploded view of the docking device 10. The docking seat molding 46 has, laterally opposed near its center, a pair of lower guide pins 76. The lower guide pins 76 are preferably disposed slightly closer to the centerline 61 and the centered data collection terminal 11. Extending guide ends 77 of the lower guide pins 76 are spherically crowned. The lower guide pins 76 are, hence, not sloped toward the center as are the upper guide pins 71. The spherically crowned lower guide ends 77 permit a smooth engagement along rounded lateral lower corners of the housing 12 of the data collection terminal 11. Laterally or transversely spaced edge guide surfaces 78 are disposed at the end of the docking channel 49 on both sides of the docking seat molding 46. The edge guide surfaces 78 constitute part of the internal shape of the docking channel 49 and are part of the retention cavity 13 adjacent the retention end 18.

As the data collection terminal 11 becomes substantially seated within the docking device 10, the lateral edge guide surfaces 78 position the data collection terminal 11 with respect to spring contacts 79. The spring contacts 79 protrude through respective contact slots 80 at a docking seat 81 formed into the docking channel 49 by the docking seat molding is 46. The upper guide pins 71 and lower guide pins 76 are preferably constructed of a low-friction plastic material, or other suitable material. By using the upper guide pins 71 and lower guide pins 76 in lieu of guiding surfaces, sliding friction forces between the data collection terminal 11 and the docking device 10 during the insertion or extraction of the data collection terminal 11 into or from the docking device 10 are advantageously minimized.

Minimal insertion forces are a distinct requirement for effortlessly inserting or removing the data collection terminal 11 from the docking device 10 as the relatively low insertion and extraction friction forces allow an operator or user of the data collection terminal 11 to one-handedly insert the data collection terminal 11 into, or to remove the data collection terminal 11 from, the docking device 10. One-handed insertion or removal of data collection terminals from docks has been attempted prior to the present invention; however, sliding friction between the data collection terminals and those docks has heretofore required an increased effort on the part of an operator.

In addition, low-friction substantially effortless, one-handed insertion or removal of the data collection terminal 11 into or out of the docking device 10 tends to reduce the risk of an operator dropping the data collection terminal 11.

In fact, such substantially effortless insertion or removal may permit an operator to direct an increased amount of his or her attention to other concurrent concerns. The guiding function of the extending guide ends 73 and 77 of the respective upper and lower guide pins 71 and 76 has been found to be smooth but precise, readily centering the data collection terminal 11 within the retention cavity 13. On full insertion of the data collection terminal 11 into the retention cavity 13 of the docking device 10, and upon optional latching of the data collection terminal 11 in such fully inserted position, the housing 12 of the data collection terminal 11 may actually be lifted slightly from the guide ends 77 of the lower guide pins 76.

The spring contacts 79 are mounted on a contact support bracket 84 of a spring contact assembly 85, with electrical conductor leads 86 leading to the communications base 21. The electrical conductor leads 86 may be part of a flexible printed circuit cable assembly, or they may consist of individual electrical leads or bonded ribbon conductors, generally referred to as a cable assembly 86. The contact support bracket 84 shows preferred mounting holes 87 for mounting the contact support bracket 84 to the underside of the docking seat molding 46 prior to its assembly as described.

Figure 7:
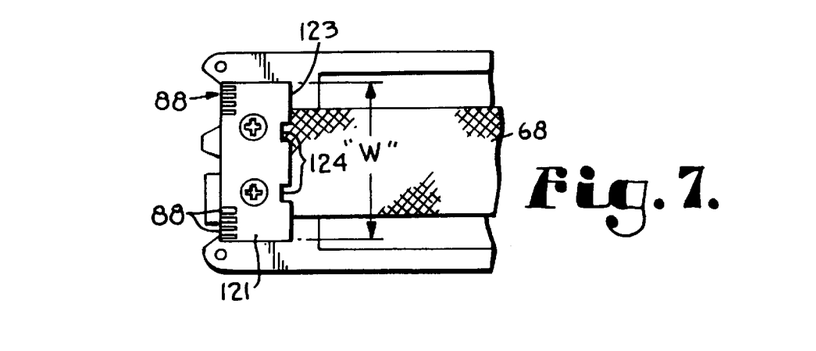
FIG. 7 is a fragmentary bottom plan view of the data collection terminal shown in FIG. 6, taken along line 7—7 of FIG. 6.

When the spring contact assembly 85 is mounted to the underside of the docking seat molding 46, the spring contacts 79 extend through the contact slots 80 into the path of the data collection terminal 11, such that a data collection terminal 11 being inserted into the docking device 10 will engage and deflect the spring contacts 79 toward the contact slots 80, thereby resiliently tensioning the spring contacts 79 to exert a contact force against complementary surface contacts 88, as shown in FIG. 7. The described structure substantially minimizes, if not entirely eliminates, tendency of the spring contacts 79 to bounce and thereby inadvertently electrically decouple from the complementary surface contacts 88 as the data collection terminal 11 is retained and latched within the retention cavity 13 of the docking device 10.

Another subassembly mounted to the docking seat molding 46, prior to its assembly into the outer housing shell 30, is a retention pawl assembly 89 of a retention pawl mechanism 90 that further includes a preferred leaf spring structure 91, preferably attached to the retention end 18 of the outer housing shell 30, such as by threaded screws, riveting, or the like. In an exemplary embodiment, the retention pawl assembly 89 includes at least one, and preferably two, retention pawl levers 93 which are assembled adjacent one another on a square pivot shaft 94, symmetrically with respect to the centerline 61. Pivot ends 95 of the retention pawl levers 93 have square mounting apertures 96 that restrict rotational movement of the retention pawl levers 93 with respect to the pivot shaft 94. Typical retainer clip rings 97 retain and support the retention pawl levers 93 from moving outwardly away from the center of the pivot shaft 94, while a compressed compression spring 98 urges the retention pawl levers 93 against the respective retainer clip rings 97. Outer ends 101 opposite the pivot or mounting ends of the retention pawl levers 93 carry upwardly pointed hooks or prongs 102, that are intended to engage and retain the data collection terminal 11 as the outer ends 101 are moved upwardly into engagement with the data collection terminal 11.

The outer ends 101 carrying the prongs 102 protrude through the docking seat molding 46 via two respective pawl openings 103. Advantageously, the pawl openings 103 and the respective protrusion of the prongs 102 are closer to the insertion end 16 of the docking device 10 than to the spring contact slots 80. Bearing ends 104 and 105 of the respective left and right latch release levers 59 and 60 have internal square openings 107 to slidingly engage the square pivot shaft 94 without rotational freedom, and have rotational bearing surfaces 109 that, upon assembly, become seated in complementary bearing apertures 110 of the docking seat molding 46. Two additional retainer clip rings 97 prevent the latch release levers, 59 and 60, from moving inward on the pivot shaft 94 such that the latch release levers, 59 and 60, remain in pivot bearing contact with the docking seat molding 46 and to permit the retention pawl assembly 89 to pivot in its entirety with respect to the docking seat molding 46.

As the assembled docking seat molding 46 is inserted into the outer housing shell 30, two complementary leaf springs 114 of the leaf spring structure 91 engage the respective retention pawl levers 93 and resiliently urge the prongs 102 upwardly through the docking seat molding 46 into the path of the data collection terminal 11 being inserted into the docking device 10. The leaf springs 114 have a desirable spring constant and a pretension, when fully extended, to urge the prongs 102 into a retaining recess of the data collection terminal 11 but, also, to urge the data collection terminal 11 in a direction toward and against the retaining ledges 63 and 64 of the docking seat molding 46 such that any clearances between the insertion space of the retention cavity 13 and the data collection terminal 11 is taken up toward the retaining ledges 63 and 64 and in a direction away from the spring contacts 79.

The normal extent of the spring contacts 79 into the docking channel 49 is such that, in an uppermost position of the data collection terminal 11, the spring contacts 79 remain in forced contact with the complementary surface contacts 88. Thus, in a static, vibration-free retention of the data collection terminal 11 within the retention cavity 13, the contact force between the spring contacts 79 and the complementary surface contacts 88 of the data collection terminal 11 will be an optimally minimum, forced contact between the respective sets of the spring contacts 79 and the surface contacts 88. Any vibration or shock which may cause movement of the data collection terminal 11 will tend to increase the contact force between the respective spring contacts 79 and surface contacts 88.

The seat base molding 48 is inserted from the retention end 18 into the outer housing shell 30. Two coil springs 116 are fitted into spring-retaining guide columns 117 of the seat base molding 48. The guide columns 117, in turn, slidingly fit into complementary guide recesses 118 of the docking seat molding 46. When the docking seat base plate 56 is assembled to the retention end 18 of the docking device 10, the coil springs 116 become compressed and the seat base molding 48 is urged in a direction toward the insertion end 16 until restrained by molded ledges 119 of the docking seat molding 46. The spring constant of the coil springs 116, their lengths, and the total compression force involved, when assembled as described herein, is desirably chosen to be in excess of the total weight of the data collection terminal 11 inserted into the docking device 10.

Figure 6:
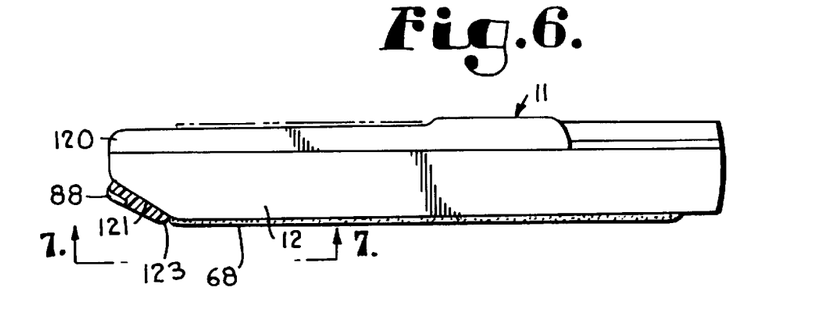
FIG. 6 is a simplified and partially sectioned side elevational view of a data collection terminal of a type which may complementarily be inserted into and retained by the one-handed dock for a portable data collection terminal.

FIG. 6, depicting a side view of the data collection terminal 11, shows a surface contact assembly 121 adjacent a lower end 120 thereof. The surface contact assembly 121 has several functions. Firstly, the surface contacts 88 of the data collection terminal 11 are molded into the surface contact assembly 121. Secondly, the surface contact assembly 121, when mounted to the lower end 120 of the data collection terminal 11, retains one end of the handstrap 68 that stretchedly extends longitudinally along the underside of the data collection terminal 11. The surface contact assembly 121 also extends away from the sloped underside of the lower end of the data collection terminal 11. An upper ledge 123 forms retaining ledges or seats 124 which are positioned to become engaged by the prongs 102, as shown in FIG. 5, to positively retain the data collection terminal 11, when inserted into the retaining cavity 13 of the docking device 10.

The upper ledge 123 forms, with the sloping housing 12, the retaining seats 124 that become engaged by the prongs 102 at substantially right angles to the longitudinal insertion direction of the data collection terminal 11 within the retention cavity 13. As the spring bias of the prongs 102 urge the data collection terminal 11 toward the retaining ledges 63 and 64, the data collection terminal 11 becomes latched into position with a positive lock. Any resiliency in the pawl levers 93 is substantially perpendicular to a removal force, and any movement of the data collection terminal 11 away from the upper retaining ledges 63 and 64 only increases the force with which the retention pawl levers 93 engage the seats in the upper ledge 123.

FIG. 7 shows a clearly defined width, "W", of the surface contact assembly 121. The surface contact assembly 121 also extends away from the housing 12 across its width "W", projecting at the lower end 120 of the data collection terminal 11 away from the generally smooth contour of the housing 12. Outer surfaces across the width of the surface contact assembly 121 are ideally chosen as reference edges. The reference edges establish a precise transverse position of the surface contacts 88 with respect to the docking device 10 as the surface contact assembly 121 is guided along the complementarily spaced edge guide surfaces 78 of the docking seat molding 46. The final alignment, prior to latching, centrally aligns the data collection terminal 11 with respect to the docking device 10.

Even with minor tolerance differences in the assembly of the surface contact assembly 121 to the housing 12 of the data collection terminal 11, the surface contacts 88 are always precisely aligned with the complementary spring contacts 79. To assure repeatability of such alignment, the opposing edge guide surfaces 78 of the docking seat molding 46 are spaced to slidingly accept the surface contact assembly 121 with a minimum of acceptable clearance beyond the width, "W", of the assembly 121. The guide ends 77 of the lower guide pins 76 preferably have generally spherically shaped surfaces with uniform rounding thereabout so as not to interfere with lateral repositioning of the data collection terminal 11 during final alignment of the respective surface contacts 88 with respect to the spring contacts 79 in the docking seat molding 46.

Figure 8:
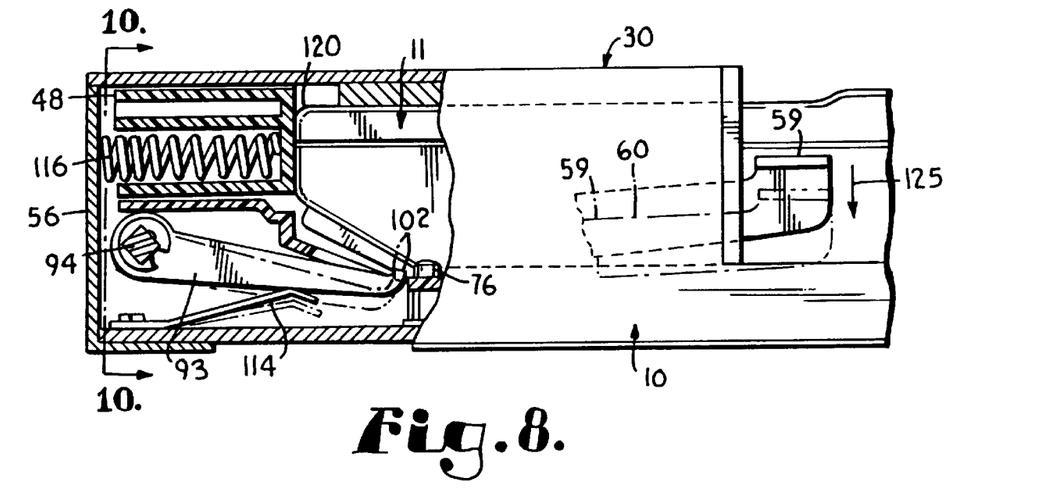
FIG. 8 is a further enlarged and fragmentary side elevational view of the one-handed dock for a portable data collection terminal, taken along line 8—8 of FIG. 3, with portions cut away to reveal details thereof.

FIG. 8 is a fragmentary, side elevational view of the docking device 10, and particularly of the retention end 18 of the docking device 10. The retention pawl mechanism 90, including the leaf springs 114 and the latch release levers 59 and 60, are shown in a primary engaged position with the data collection terminal 11 being in a fully inserted position. In this fully inserted position, the coil springs 116 are compressed and the seat base molding 48 exerts an urging force against the lower end 120 of the data collection terminal 11. The latch release levers 59 and 60 are both directly coupled through the pivot shaft 94 to the retention pawl levers 93. As either of the latch release levers 59 or 60 is depressed downwardly as indication by an arrow designated by the numeral 125 in FIG. 8, the retention pawl levers 93 pivot in unison with the pivot shaft 94, and the prongs 102 are moved to an alternate, disengaged position, as shown by the phantom lines for illustrative purposes only.

Figure 15:
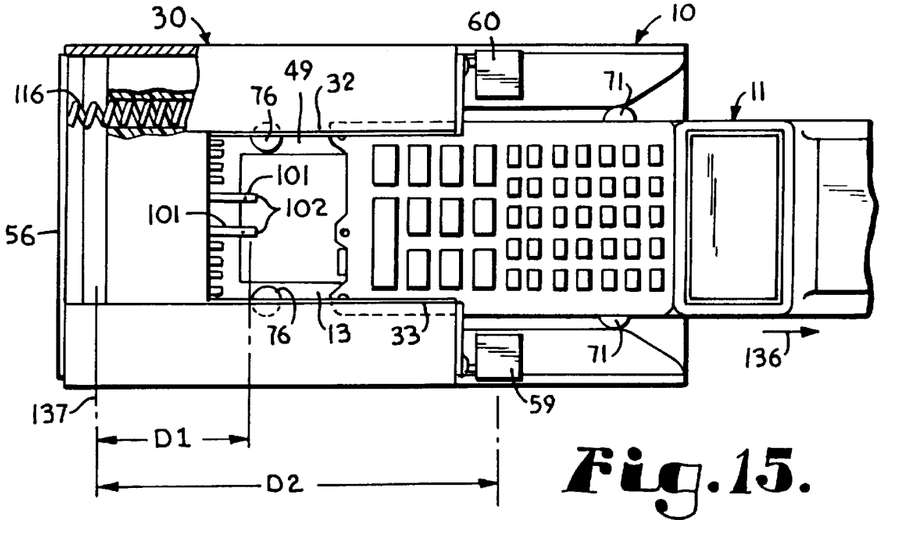
FIG. 15 is a still further enlarged and fragmentary, top plan view of the one-handed dock for a portable data collection terminal, showing a data collection terminal partially removed from the dock and showing a spring biased seat biased in an upward or forward biased position closer to an insertion end of the dock, according to the present invention.

As the prongs 102 are being moved to the disengaged position, the data collection terminal 11 is released from the latched or positively locked retention position. Also, the seat base molding 48 urges the data collection terminal 11 toward the insertion end 16 of the docking device 10. Allowing the latch release lever, either 59 or 60, to return to its normal position after a mere momentary depression no longer accomplishes a return of the prongs 102 to their prior position against the retention seats 124 in the upper ledge 123 of the surface contact assembly 121. The data collection terminal 11 has then already moved from its fully inserted position to a different position, such as resting against the seat base molding 48, for example, as shown in FIG. 15. In addition, the seat base molding 48 has been urged by the coil springs 116 against the molded ledges 119.

The retention pawl mechanism 90 accomplishes, as described, an automatic latching of the data collection terminal 11 into the docking device 10 as the data collection terminal 11 is fully inserted against the spring bias exerted by the seat base molding 48. It should be apparent that the docking arrangement provided by the present invention is readily accomplished by an operator with a single-handed movement, no other manual locking operation being necessary. When it is desired to remove the data collection terminal 11 from the docking device 10, a single-handed operation is, again, all that is required to release the data collection terminal 11. By depressing either of the latch release levers 59 or 60, the data collection terminal 11 is released, but remains loosely retained in the docking channel 49 to be removed by an operator at will. The retention pawl mechanism 90 accomplishes thereby a desired single-handed latch and release function of the docking device 10, including a selectively implemented non-latched, temporary holding function for a data collection terminal 11.

Figure 9:
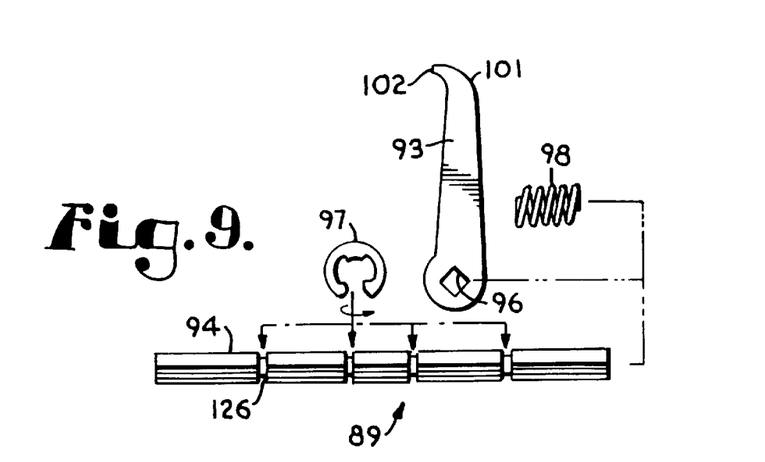
FIG. 9 is a further enlarged view of an assemblage of elements of a pivot shaft assembly of the one-handed dock for a portable data collection terminal.
Figures 10, 11:
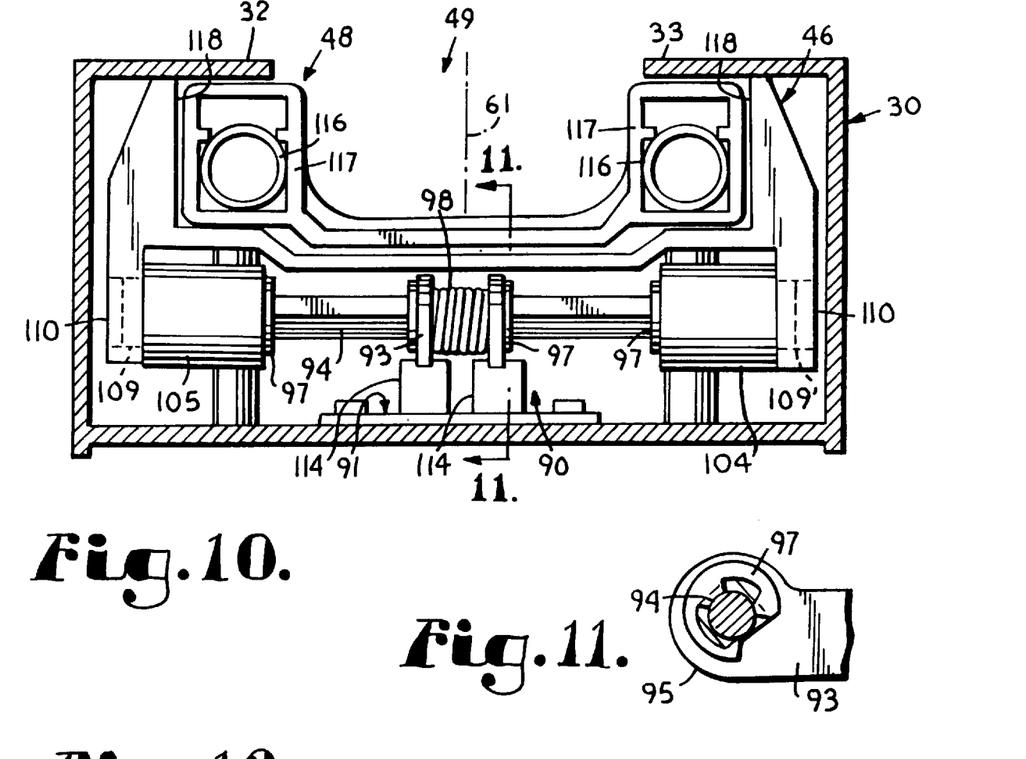
FIG. 10 is a further enlarged, cross-sectional view of a retention end of the one-handed dock for a portable data collection terminal, taken along line 10—10 of FIG. 8.
FIG. 11 is a further enlarged view of the pivot shaft assembly of the one-handed dock for a portable data collection terminal, taken along line 11—11 of FIG. 10.

FIG. 9 shows an exploded view of parts of the retention pawl assembly 89. The retainer clip rings 97 are insertible into grooves 126 that retain the retention pawl levers 93 on the square pivot shaft 94 with the compression spring 98 disposed there between. FIG. 10 shows the assembled retention pawl mechanism 90 in the end view of the retention end 18 of the docking device 10. The latch release levers 59 and 60 are assembled onto the pivot shaft 94 and are, with their circular bearing surfaces 109, disposed within the corresponding molded bearing apertures 110 of the docking seat molding 46. The seat base molding 48 is guided by the docking seat molding 46 and is retained within the outer housing shell 30, particularly by the caps 32 and 33 thereof. In FIG. 11, a placement of the retainer clip ring 97 on the pivot shaft 94 and against the retention pawl lever 93 is depicted, showing a circularly machined neck of the groove 126 in the pivot shaft 94.

Figure 12:
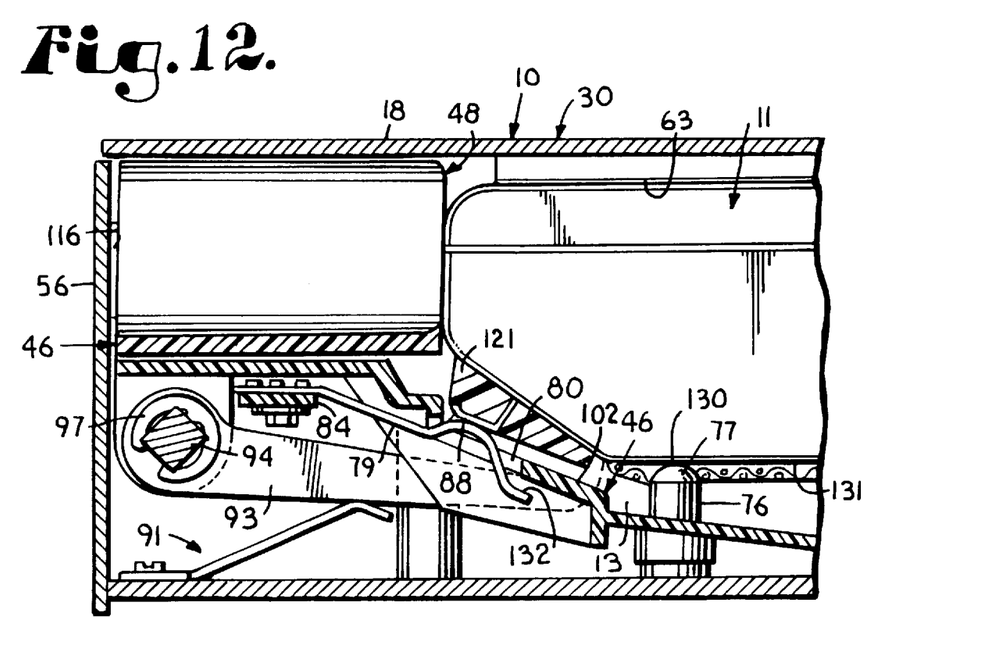
FIG. 12 is a still further enlarged and fragmentary, partially cross-sectional view of the retention end of the one-handed dock for a portable data collection terminal, showing a portion of a data collection terminal retained within the dock and a contact engaging the data collection terminal as the data collection terminal is held in such retained position.

FIG. 12 is an enlarged cross-sectional side view illustrating a mounting of the spring contact assembly 85 to an underside of the docking seat molding 46. The spring contacts 79 extend through respective contact slots 80 through the docking seat molding 46 and into contact with the respective surface contacts 88 on the surface contact assembly 121. Because of the urging force of the prong 102 against the lower end 120 of the data collection terminal 11, a gap 130 may exist between the guide ends 77 of the lower guide pins 76 and an underside 131 of the data collection terminal 11. Thus, when fully inserted and in a latched position within the docking device 10, the data collection terminal 11 would typically be biased, at least at the retention end 18 of the docking device 10, against the retaining ledges 63 and 64.

In such upwardly biased position, the spring contacts 79 exert a minimum, yet optimum, contact force against the respective, mating surface contacts 88 of the data collection terminal 11. Any vibration of the data collection terminal 11 within the retention cavity 13 with vibratory movement toward the lower guide pins 76 tends to increase the contact force between the spring contacts 79 and the surface contacts 88.

Also, the mass of the spring contacts 79 is much less than the mass of the data collection terminal 11 such that, in a vibratory environment of the docking device 10, the spring contacts 79 tend to track any vibratory movement of the data collection terminal 11 between the retaining ledges, 63 and 64, and the lower guide pins 76, thereby virtually eliminating any risk of contact bounce between the spring contacts 79 and the surface contacts 88 of the data collection terminal 1. Any risk of contact bounce between the respective spring contacts 79 and surface contacts 88 would be highly detrimental to a contemplated function of the docking device 10 for transferring data between the data collection terminal 11 and other data devices (not shown but represented by the docking device 10) which may be coupled directly or indirectly to the docking device 10. Thus, once a data collection terminal 11 has been inserted and locked into the docking device 10, batteries of the data collection terminal 11 may be recharged and, simultaneously therewith, data may be up-loaded or down-loaded between another data device, represented by the docking device 10, and the data collection terminal 11.

An outer end 132 of the spring contacts 79 normally rests against the underside of the docking seat molding 46, the outer end 132 serving as a restraint to excessive movement of the spring contacts 79 into the retention cavity 13. The outer ends 132 therefore allow the spring contacts 79 to have an initial spring bias force designed into the spring contacts 79 in order to maintain a minimum contact force between the spring contacts 79 and the surface contacts 88. An angular orientation of the surface contacts 88 with respect to the longitudinal extent of the data collection terminal 11 tends to cam the spring contacts 79 slopingly against the surface contacts 88 as the data collection terminal 11 is inserted and latched into the docking device 10. The sloped orientation of the surface contacts 88 and the resulting camming action during the insertion of the data collection terminal 11 advantageously provide for contact wiping action during each insertion operation of the data collection terminal 11. The sloped orientation of the surface contacts 88 may also provide limited contact wiping action during vibrational movement of the data collection terminal 11 within the docking device 10.

Figure 13:
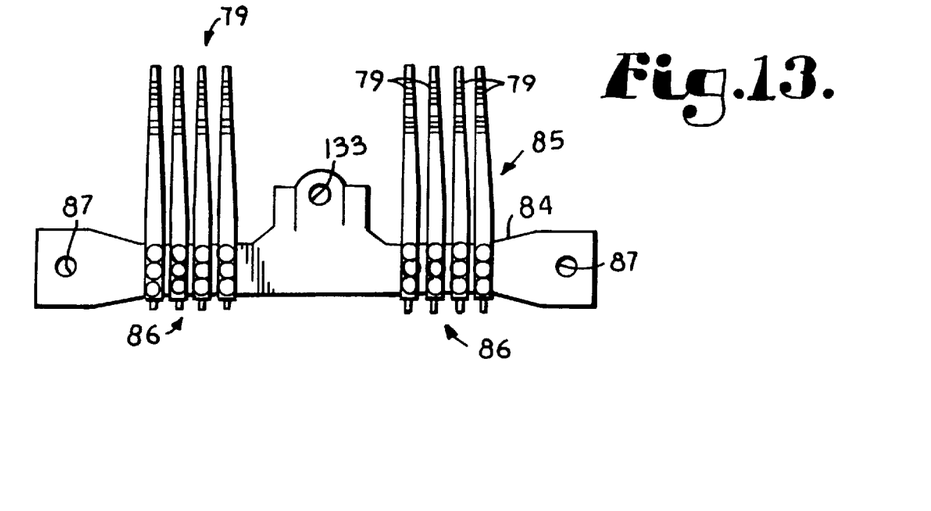
FIG. 13 is a still further enlarged view of a spring contact assembly of the one-handed dock for a portable data collection terminal.

An enlarged view of the spring contact assembly 85 is shown in FIG. 13. The spring contacts of the spring contact assembly 85 are preferably molded into, but may otherwise be attached to, the contact support bracket 84. A third mounting orifice 133, which is offset from the mounting holes 87, provides torsional stability to resist the spring force exerted on the contact support bracket 84 when the spring contacts 79 engage the surface contacts 88 of the data collection terminal 11.

Figure 14:
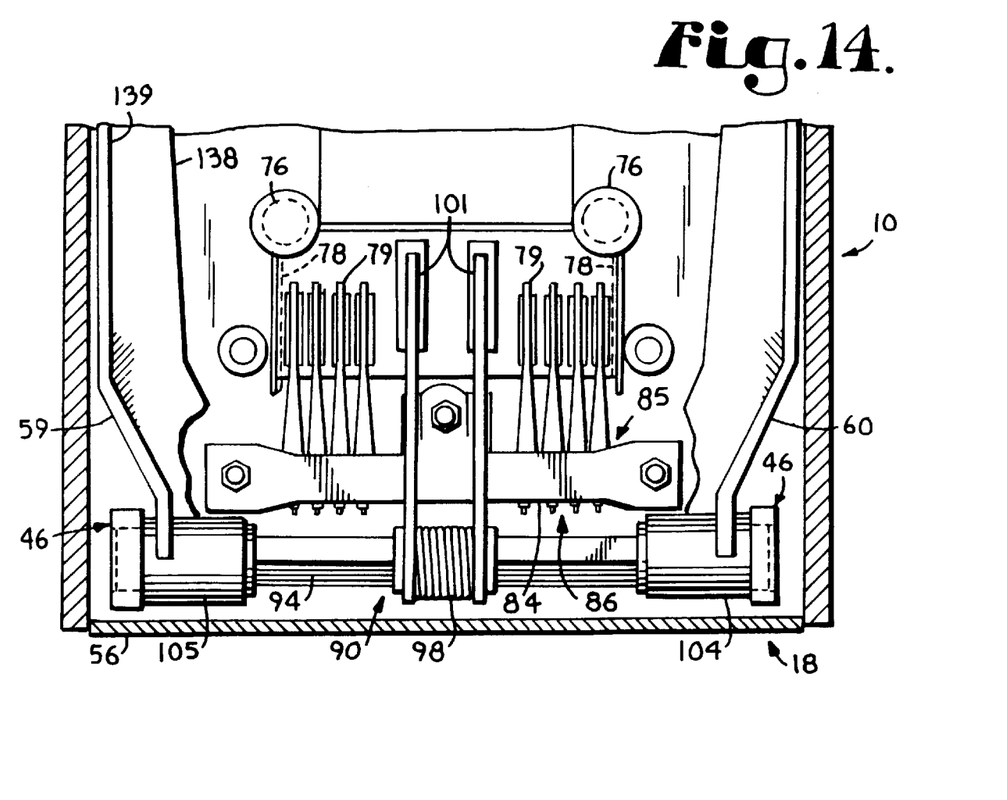
FIG. 14 is a still further enlarged and fragmentary, partially cross-sectional bottom view of the retention end of the one-handed dock for a portable data collection terminal, showing portions cut away to reveal details thereof.

FIG. 14 shows particular details of the preferred guiding arrangement for the data collection terminal 11 at the retention end 18 of the docking device 10. The lower guide pins 76 provide sliding support for the data collection terminal 11, while opposing edge guide surfaces 78 guide the data collection terminal 11, see FIG. 3, into contact with the spring contacts 79.

FIG. 15 shows a plan view of the data collection terminal 11 being removed in a direction toward the insertion end 16 of the docking device 10, as indicated by an arrow designated by the numeral 136. FIG. 15 also shows a mechanical advantage in the latch release levers 59 and 60 with respect to the force application by the prongs 102 against the data collection terminal 11, as the data collection terminal 11 is fully inserted into the docking device 10. "D1" designates a first distance from an axis 137 of the pivot shaft 94 to the prongs 102, whereas "D2" designates a second distance, from the pivot axis 137 to where an operator would have access to the latch release levers 59 and 60, that is desirably significantly longer than "D1". A depression force on either of the latch release levers, 59 or 60, to release the retention pawl levers 93 from engagement with the data collection terminal 11, is a corresponding fraction of the force by which the prongs 102 force an inserted data collection terminal 11 upwardly against the retaining ledges 63 and 64 beneath the caps 32 and 33.

The latch release levers 59 and 60 are preferably formed of a light molded plastic structure in order to minimize weight and mass of the latch release levers 59 and 60. Strength of the latch release levers 59 and 60 is enhanced by providing an angular structure therefor. Accordingly, the release levers 59 and 60 are both formed or molded of respective horizontally and vertically disposed strip-like walls or beams, that are respectively designated by the numerals 138 and 139, as shown in FIG. 14. The beams 138 and 139 are merged along a common corner into a unitary structure having angular cross section. The angular structure of the latch release lever 60 is preferably a mirror image of that of the release lever 59, also having horizontal and vertical beams 138 and 139 that merge along one edge into a structure having angular cross section, as shown in the drawings. Other ways of minimizing the weight versus strength of the release levers may be implemented in view of the teaching herein of the need to minimize the mass of the latch release levers 59 and 60. A mass or weight minimization is also desirable to avoid accidental release of the data collection terminal 11 under severe shock conditions.

Figures 16, 17:
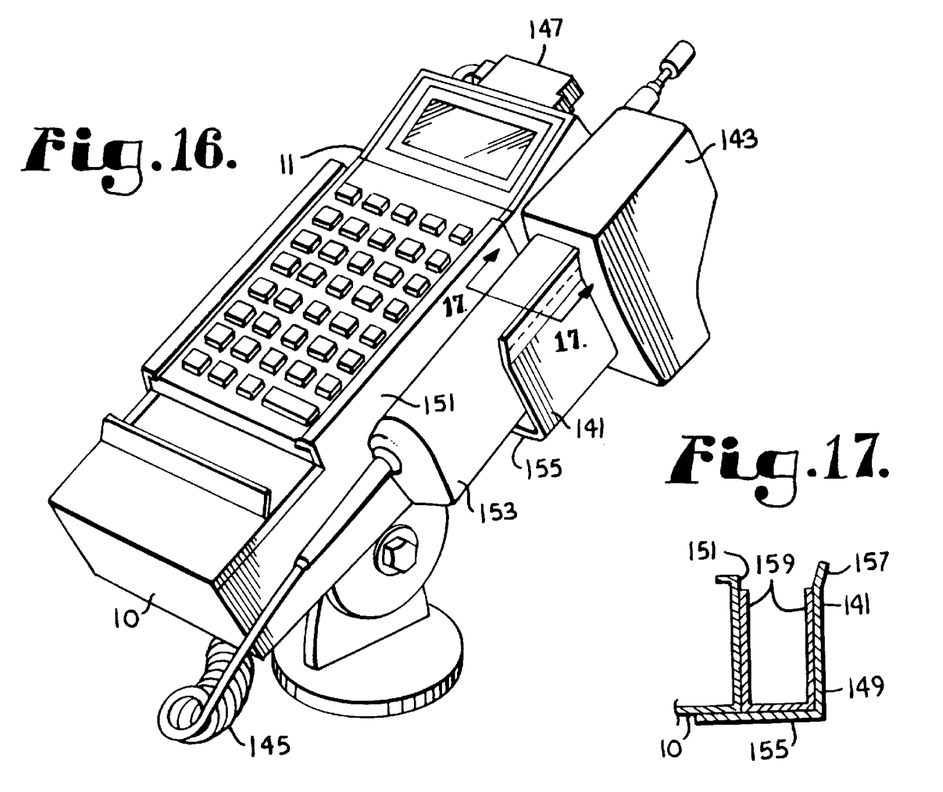
FIG. 16 is a perspective view of the one-handed dock for a portable data collection terminal, showing a scanner received in a scanner bracket thereof.
FIG. 17 is a fragmentary and cross-sectional view of the scanner bracket of the one-handed dock for a portable data collection terminal, taken along line 17—17 of FIG. 16, according to the present invention.

The docking device 10 optionally includes a bracket 141 for receiving a scanner 143, such as a laser scanner, operably connected to the data collection terminal 11, such as by a spirally wound cord 145. As the lower end 120 of the data collection terminal 11 will be inserted into the docking device 10, the cord 145 in connected through a connector 147 to the data collection terminal 11.

The bracket 141 has an outer retaining wall 149 that is spaced from a side wall 151 at a distance that is less than the width of a handle 153 of the scanner 143, and a lower retaining wall 155 that spaces the scanner 143 generally alongside the data collection terminal 11 as it is contained within the docking device 10. The outer retaining wall 149 has a flare 157 to facilitate insertion of the scanner 143 into the bracket 141.

The outer retaining wall 151 and the lower retaining wall 155 are constructed of resilient material such that the scanner 143 is reliably clamped into the bracket 141 as the scanner 143 is inserted thereinto, but not so tightly but what the scanner 143 can be readily, swiftly and one-handedly removed by a user. If desired, the bracket 141 may also include cushioning means 157 to dampen vibrations developed in a more abusive environment, as hereinbefore described.

The scanner 143 can be removed for operable use as the data collection terminal 11 remains in the docking device 10, in which event controls of the data collection terminal 11 are accessible to the user for interactive input while using the scanner 143, if necessary.

Figure 18:
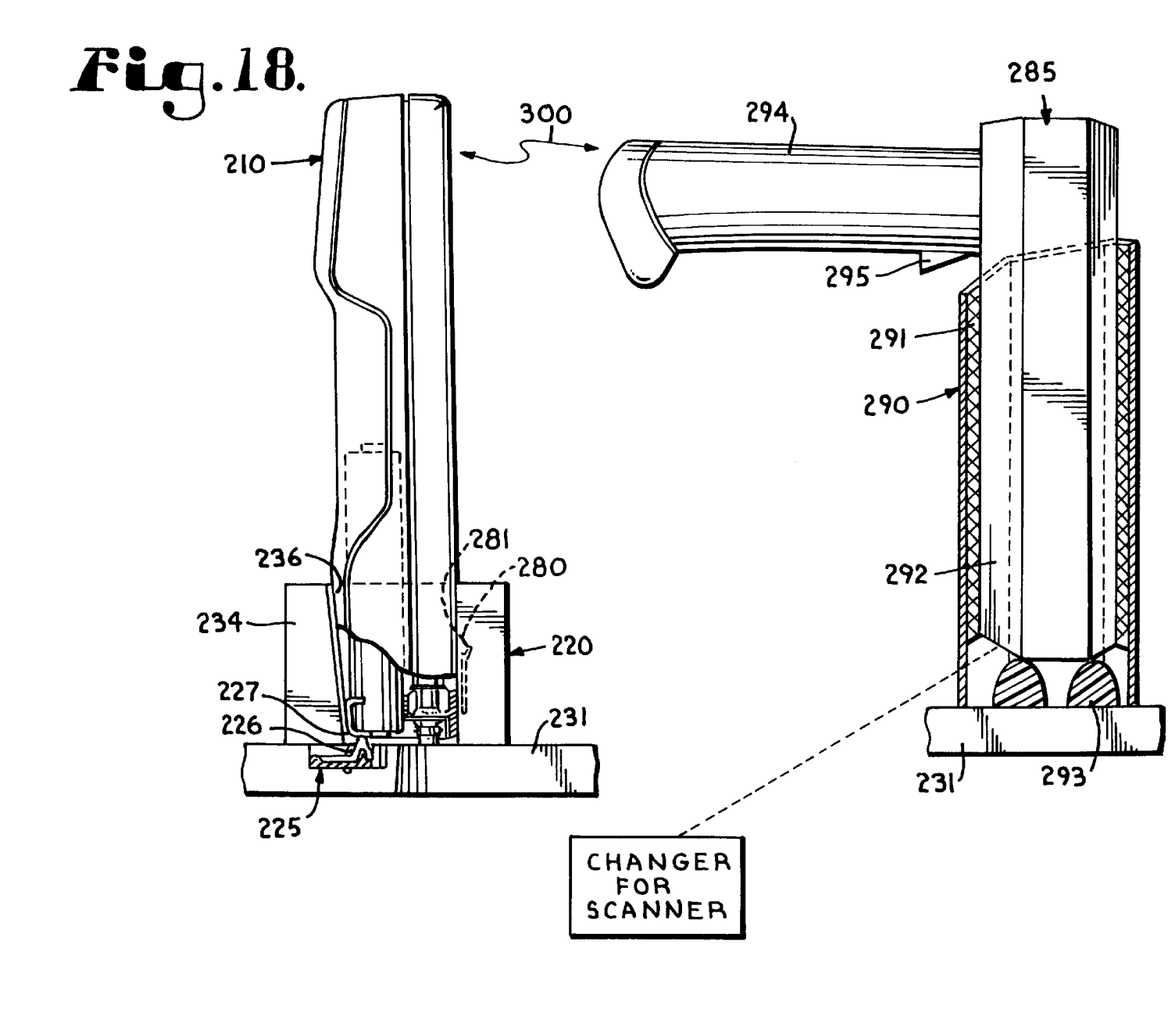
FIG. 18 is somewhat diagrammatic partial vertical sectional view illustrating constructional details of a preferred adapter for receiving a portable battery powered terminal, the terminal being shown as being inserted part way into the adapter channel, to the point of initial electrical contact; and also indicating in diagrammatic fashion a laser bar code scanner device in a separate vehicle mounting or holster means and coupled with the terminal via a wireless link.

Referring to FIG. 18, a terminal 2 10 is shown in initial contact with an adapter indicated at 220. The adapter may have a contact assembly 225 including spring fingers 226 aligned with respective terminal contacts 227. In FIG. 18, adapter 220 is shown as comprising a base part 231 which has a pair of upstanding generally C shaped parts such as 234 which define a channel for receiving the terminal 210. The parts 233 may have sloping surfaces such as 236 which limit the downward movement of a terminal into the receiving channel, and serve to frictionally retain the terminal with a suitable degree of pressure between contacts such as 227 and mating spring fingers such as 226.

Each connection such as 226, 227, FIG. 18, may be maintained by a frictional ball and socket type detent such as indicated at 280 which seats with an audible click into a terminal recess 281 when correct deflection of spring contacts 226 has been achieved.

FIG. 18 shows a holster 290 on base 231 for receiving and securely retaining a scanner such as 285, e.g. by a resilient liner 291 of the holster 290 frictionally engaging with a barrel 292 of the scanner. The holster 290 may be constructed e.g. at 293 to hold the handgrip part 294 and trigger 295 clear thereof so that the scanner is quickly and easily removed by manually grasping the handgrip part 294, and so that the trigger 295 will not be actuated as the scanner is manually inserted into the holster 290.

The scanner for bar codes need not be physically attached to the terminal. In configurations for warehouse scanning systems, a lot of the software effort involved may represent the accommodation of the periodic removal of major sections of the system to do remote scanning of marginally accessible codes. In conventional practice the scanner is always attached to the terminal by a pendant cable and if the code to be scanned is beyond the reach of the cable then the terminal must necessarily be removed from its holster. The terminal may represent a very significant portion of a "LAN" system and to remove it in this fashion may disable the system generally. Placing the terminal in its holster again may entail the reestablishment of the hierarchial or virtual address structure that was established prior to the removal of the terminal.

If, however, it is possible to only remove the scanner and to not be tied to the terminal by a cable then the degree of disability imposed upon the "LAN" system is significantly lessened and the software effort to develop such a system would be reduced. The terminals now incorporate various types of scanner interfaces. Some of them have been add-on devices to accommodate scanner types manufactured by third parties. Others have been built-in and have been used to communicate with scanners such as shown in U.S. Pat. No. 4,766,300 issued Aug. 23, 1988 to Chadima. Some of these handheld terminal devices provide power converters accommodating the requirements idiosyncratic to specific scanner types. All of such scanners directly draw power from the terminal, reducing operational time per battery charge.

A scanner such as 285, FIG. 18, may be operated while disconnected from the terminal on a permanent basis. Terminals presently connect with a host by an RF link and maintain contact without benefit of cable. Of course, terminals mounted on a vehicle will be drawing their power from the vehicular electrical system. The power requirements for a scanner connected by a cable to a terminal on a vehicle will not be a large factor in the power budget imposed upon the terminal.

Detaching the terminal from the scanner 285 completely, provides benefits in the area of flexibility and ease of use. Since the scanner 285 doesn't require contact with or attachment to the terminal the job of providing operating power no longer is the province of the terminal. The scanner, being completely portable would require its own battery pack but this pack would not have to be unusually capacious. Once the scanning function has been performed the scanner can be reinserted in its holster 290 on the vehicle and charged back up to full capacity from the vehicle power by its own charger indicated at 297.

The communication link replacing the cable may be ultrasonic but could also be infrared or even another very low power RF link as diagrammatically indicated at 300. Various modulation and demodulation schemes could be employed and the choice of the most appropriate means of encoding data on the channel would depend greatly upon the channel type used. Once the code had been read, the link between the scanner and the terminal could employ one of the various error checking and correcting procedures.

Physically the terminals would still incorporate a form of scanner interface but the link would not be mechanical. It would be desirable to provide a bidirectional data path. The scanner would include the matching interface to implement the link and using a bidirectional data path the scanner could receive an acknowledgment after a scan. Reception of such an acknowledgment would constitute an indication of a valid scan and the illumination of an indicator light would provide operator feedback. The lack of a response from the terminal in a specified time period would constitute a negative acknowledgment and another indication on the scanner would signal the operator that another scan was necessary.

Appropriate scanners for this type of operation would include current wand and modified CCD type scanners of Norand Corporation and a number of other manufacturer's laser scanners.

This scanner would be used typically, by a forklift operator in close proximity to his vehicle. Limited range would not be a significant deterrent here and may even be a benefit in an operation where multiple units are in use.

It is to be understood that while certain forms of the present invention have been illustrated and described herein, it is not to be limited to the specific forms or arrangement of parts described and shown.

Various other changes and modifications in the use and implementation of the described embodiments are possible without departing from the spirit and scope of the invention as set forth in the claims.

What is claimed is:

1. In a data collection system, an end-insertion docking device and a data collection terminal having a plurality of surface contacts, said docking device comprising:
   a) a docking channel having a longitudinal extent and an insertion end with an insertion opening at said insertion end, a retention end longitudinally opposite from said insertion end, said docking channel having a base wall and having retention surfaces disposed spacedly opposite said base wall, forming a retention cavity therebetween;
   b) means for latching the data collection terminal into, and releasing the latched data collection terminal from, said docking device by a user using only one hand; and
   c) a scanner operably connected to the data collection terminal, and a bracket for receiving the scanner;
the docking device having resilient means for engaging the surface contacts of the terminal to effect charging of the terminal while the terminal is latched into the docking device.

2. The data collection system according to claim 1, further comprising:
   a) said resilient means comprising a plurality of spring contacts extending into said docking channel; and
   wherein said docking channel has guide surfaces to slidingly guide the plurality of surface contacts of the data collection terminal into alignment with said plurality of spring contacts as the data collection terminal is inserted into said docking device.

3. The data collection system according to claim 1, wherein the scanner is a laser scanner.

4. The data collection system according to claim 1, wherein said bracket includes cushioning means for cushioning the scanner inserted into said bracket.

5. The data collection system according to claim 1, wherein the scanner is inserted into the bracket, the data collection terminal having controls which remain accessible to a user with the terminal inserted into said docking channel, and a wireless link between the terminal and the scanner.

6. A data collection system comprising an end-insertion docking device and a data collection terminal having a plurality of surface contacts, said docking device comprising:
   a) a docking channel having a longitudinal extent, an insertion end with an insertion opening and a retention end spaced longitudinally opposite from the insertion end, the docking channel further having a base wall and terminal retention surfaces spaced opposite from the base wall such that a retention cavity is formed therebetween;
   b) a plurality of spring contacts protruding into the docking channel, and guide surfaces forming part of the docking channel such that the plurality of surface contacts of the data collection terminal are guidable into alignment with said plurality of spring contacts;
   c) means for engaging the data collection terminal into, and for removing the data collection terminal from, said docking device by a user using only one hand; and
   d) a scanner operably connected to the data collection terminal, and a bracket receiving said scanner.

7. The data collection system according to claim 6, wherein said means for removing the data collection terminal from said docking device includes a single release mechanism that is adapted to disengage the data collection terminal from said plurality of spring contacts.

8. The data collection system according to claim 7, wherein said release mechanism operably disengages the data collection terminal from said plurality of spring contacts substantially in a direction from said retention end toward said insertion end.

9. The data collection system according to claim 6, wherein said plurality of spring contacts are adapted to reliably engage the plurality of surface contacts of the data collection terminal in a vibration-prone environment.

10. In a data collection system, an end-insertion docking device and a data collection terminal having a plurality of surface contacts, said docking device comprising:
   a) a docking channel having a longitudinal extent and an insertion end with an insertion opening at said insertion end, a retention end longitudinally opposite from said insertion end, said docking channel having a base wall and having retention surfaces disposed spacedly opposite said base wall, forming a retention cavity therebetween; said retention surfaces disposed to provide access to controls of the data collection terminal as the data collection terminal is fully inserted into the docking channel;

b) means for selectively inserting the data collection terminal into, and removing the data collection terminal from, said docking channel by a user using only one hand; and c) a scanner bracket and a scanner received by the bracket and operably connected to the data collection terminal as the data collection terminal is inserted into the docking channel; said scanner bracket configured such that the scanner is readily removable from the scanner bracket by the user.

11. In a data collection system, a data collection terminal having a terminal display and a plurality of battery charging contacts arranged for receiving battery charging current, said system further comprising:

(a) a docking installation comprising a docking receptacle having a longitudinal extent, an insertion end and a retention end spaced longitudinally opposite from the insertion end, with a terminal receiving space extending longitudinally from the retention end for accommodating said terminal as it is inserted into the docking receptacle beginning at the insertion end;

(b) a plurality of electrically conductive contacts protruding into the terminal receiving space and resiliently deflectable in response to engagement with the respective battery charging contacts of the terminal;

(c) guide surfaces forming part of the docking receptacle such that the plurality of battery charging contacts of the data collection terminal are guidable into alignment with said plurality of electrically conductive contacts;

(d) the construction of the docking receptacle and of the guide surfaces providing for engaging the data collection terminal into, and for removing the data collection terminal from, said docking device by a user using only one hand;

(e) said docking installation having a scanner operably connected to the data collection terminal; and (f) said docking installation being of construction such that the terminal display remains accessible to a user substantially in its entirety while the terminal and scanner are held by the docking installation.

12. A data collection system according to claim 11, with said data collection terminal together with said scanner being held by said docking installation such that the terminal is removable by a user in a single motion.

13. A system according to claim 12, with said scanner comprising a deflected beam laser scanner.

14. A system according to claim 13, with said data collection terminal being operably connected with said laser scanner via a wireless link.

15. A system according to claim 14, with said laser scanner having a rechargeable battery, and said docking installation providing for recharging of the rechargeable battery of the laser scanner.

16. A system for facilitating data collection operations, said system comprising:

(a) a data collection terminal and an indicia reader operably coupled with the terminal, said terminal having a rechargeable battery and a user interface for observation by a user;

(b) a docking installation releasably receiving said data collection terminal and indicia reader for recharging of said battery; and (c) the construction of the docking installation providing unobstructed access to the user interface substantially in its entirety during recharging of the battery and providing for removal of the terminal with a single motion.

17. A system according to claim 16, with said indicia reader comprising a deflected beam laser scanner.

18. A system according to claim 16, with said data collection terminal being coupled with said indicia reader via a wireless link.

19. A system according to claim 16, with said indicia reader having a battery enabling operation of the indicia reader without a cable connection to said terminal.

20. A system according to claim 16, with said indicia reader being wirelessly coupled with the terminal and being removable from the docking installation by a user using only one hand.

* * * * *